United States Patent [19]

Kling

[11] 4,342,068
[45] Jul. 27, 1982

[54] MOUNTING ASSEMBLY FOR SEMICONDUCTOR DEVICES AND PARTICULARLY POWER TRANSISTORS

[75] Inventor: Jarrett B. Kling, Rochester, N.Y.

[73] Assignee: Teknational Industries Inc., Rochester, N.Y.

[21] Appl. No.: 205,366

[22] Filed: Nov. 10, 1980

[51] Int. Cl.³ .............................................. H05K 7/20
[52] U.S. Cl. .................................... 361/386; 361/388; 361/399; 357/81
[58] Field of Search .............. 357/79, 81; 174/52 FP, 174/16 HS; 361/386, 388, 395, 399

[56] References Cited

U.S. PATENT DOCUMENTS

| | | | |
|---|---|---|---|
| 2,737,579 | 3/1956 | Wehrlin | 361/388 |
| 3,859,570 | 1/1975 | Veranth | 361/386 |
| 4,266,267 | 5/1981 | Ruegg | 361/386 |

Primary Examiner—Gerald P. Tolin
Attorney, Agent, or Firm—Martin LuKacher

[57] ABSTRACT

A mounting assembly for a semiconductor device, particularly a power transistor, which encloses and holds the device upon a plate which serves as a heat sink securely on a printed circuit board has a cover enclosing the device and a spacer. Holes in the spacer, a flange on the device, the plate, the cover and the printed circuit board receive one or more bolts which independently and securely clamp the flange and heat sink plate between the spacer and the board and also independently clamp the cover to the board.

10 Claims, 4 Drawing Figures

MOUNTING ASSEMBLY FOR SEMICONDUCTOR DEVICES AND PARTICULARLY POWER TRANSISTORS

DESCRIPTION

The present invention relates to mounting assemblies for semiconductor devices and particularly to a mounting assembly for securing a power transistor and a conductive member, which serves as a heat sink to dissipate heat from the transistor, while covering the transistor with a cover member which encompasses the transistor and is held over the transistor upon a printed circuit board to provide an electrical shield to prevent arcing between the heat sink, power transistor and printed circuit board.

It has been recognized that power transistors and other semiconductor devices be mounted on printed circuit boards in a manner to permit heat sinks which dissipate the heat generated by the transistor or other device to be dissipated while enclosing the transistor so as to safeguard against tampering and protect against electrical shock if someone touches the transistor. It is necessary that the mounting assembly be low in cost and easy to assemble. It is also necessary that the mounting assemble hold the transistor or other device with which it is used securely on the printed circuit board to which the transistor or other device is connected and also prevent arcing between the heat sink, transistor and printed circuit board.

Accordingly it is an object of the present invention to provide an improved mounting assembly for semiconductor devices and particularly for power transistors and at the same time prevent arcing in the assembly.

It is another object of the present invention to provide an improved mounting assembly for transistors or other semiconductor devices to provide thermal contact with a heat dissipating member while covering, insulating and protecting the device.

It is a further object of the present invention to provide an improved assembly for semiconductor devices, particularly power transistors, which mounts them on a circuit board and a heat sink plate so as to provide good thermal contact while covering and protecting the transistor.

Briefly described an assembly for mounting a semiconductor device or transistor having a flange upon a printed circuit board on which a heat dissipating (sink) member is disposed in accordance with the invention makes use of a cover, desirably of insulating material, having a top wall and side walls which define an opening higher than the device and larger than the flange. The cover provides an electrical shield. The device is received in the opening. The device is disposed with the flange upon the heat dissipating member and spaced from the circuit board by the heat dissipating member. A hole in the flange and holes in the top wall, the heat dissipating member and the board are all in alignment with each other. A spacer, which is desirably also of insulating material, having a hole is disposed upon the flange between the top wall of the cover and the flange with the hole in the spacer aligned with the holes in the top wall, the flange, the member and the board. Threaded fastener means are associated with the spacer and extend through the aligned holes and into the spacer for independently clamping, first the heat dissipating member and the flange between the spacer and the board, and second the cover upon the heat dissipating member. The cover is also adapted to clamp against an electrically insulating pad disposed on the heat dissipating member which prevents arcing between the transistor, heat dissipating member, and printed circuit board. The connection between the cover and the dissipating member may be referred to as a "butt joint." With this assembly electrical arcing between adjacent transistors is prevented. The assembly allows transistors, particularly power transistors, to be spaced closer to each other than would otherwise be possible.

The foregoing and other features, objects and advantages of the invention as well as the presently preferred embodiments thereof will become more apparent from a reading of the following description in connection with the accompanying drawings in which.

Figures 1, 2, 3:
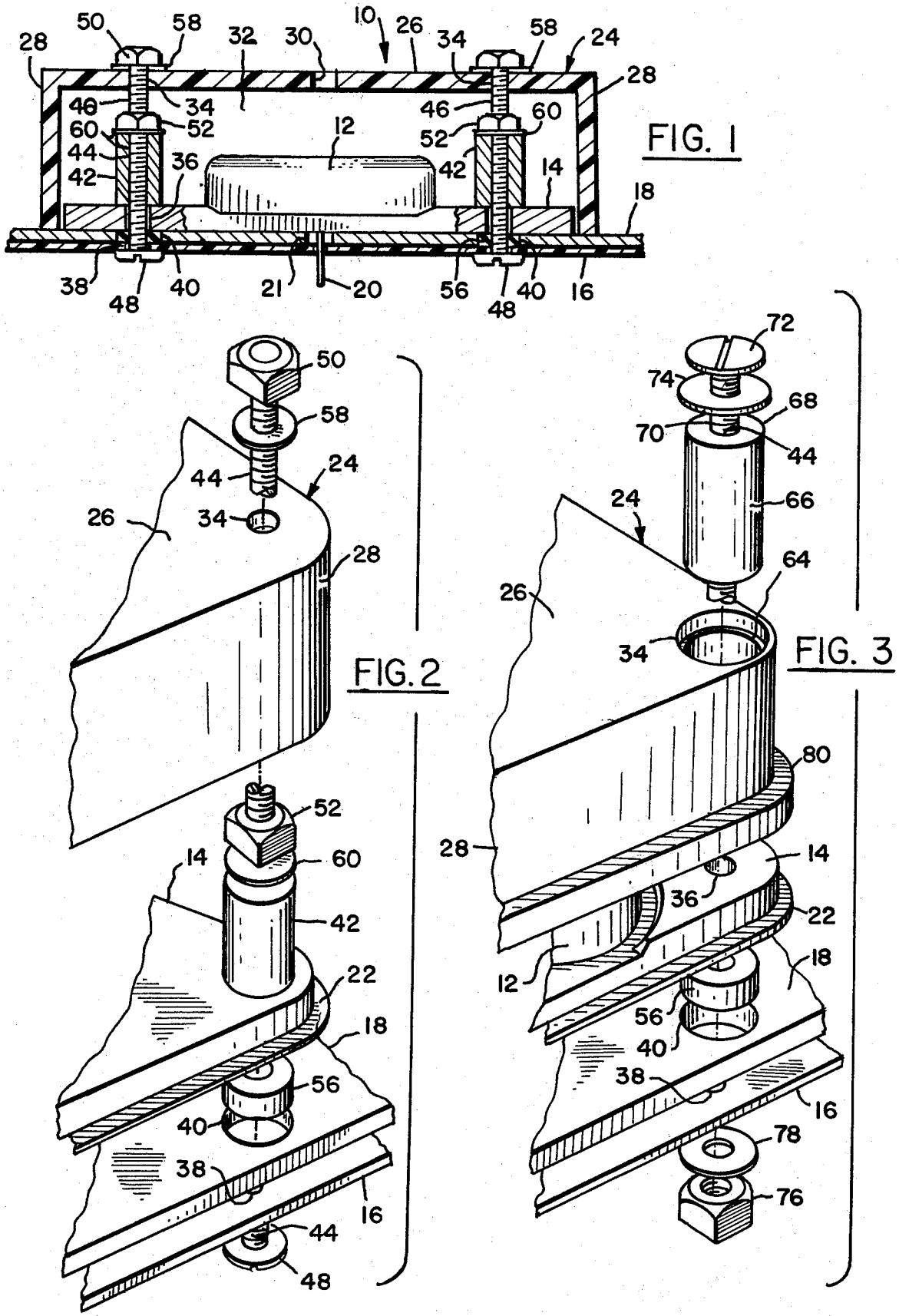
FIG. 1 is a front view, partially in section, showing a mounting assembly in accordance with one embodiment of the invention.
FIG. 2 is an exploded view showing a portion of the mounting assembly shown in FIG. 1 slightly modified.
FIG. 3 is an exploded view similar to FIG. 2 showing another embodiment of the mounting assembly in accordance with the invention.

Referring first to FIGS. 1 and 2, the mounting assembly 10 is adapted to mount a power transistor 12 having a flange 14 on a printed circuit board 16. A conductive metal plate 18 is disposed on the printed circuit board 16. The flange 14 of the transistor 12 is disposed on the plate. Leads 20 from the transistor extend through the heat sink plate 18 and may be connected to printed wiring on the board 16. Connections to the board may be provided from the flange 14 of the transistor which is connected to one of the electrodes, for example the emitter of the transistor. Alternatively, as shown in FIG. 2 the flange 14 may be in thermal contact with the plate 18 but electrically insulated from the plate 18 by a pad or gasket 22 of thermally conductive, but electrically insulating material such as silicon rubber. Such pads are known in the trade as "Sil Pad."

A cover 24 has a top wall 26 and side walls 28. The cover may have a vent hole 30 to allow hot air to be dissipated from an opening 32 which is defined between the side walls 28 and encompasses the flange 14. The top wall has holes 34. The flange has a hole 36 and the board and heat sink plate have holes 38 and 40. These holes are aligned with each other and threaded fastening means extends therethrough. These threaded fastener means cooperate with spacers 42 which is desirably of conductive material. The threaded fastener includes bolts 46. The spacer also has a hole 44 which is aligned with the other holes. The holes 36 and 38 are somewhat larger than the bolt 46, in diameter. The head 48 of each bolt 46 is located adjacent the printed circuit board 16, and nuts 50 desirably nonconductive (nylon) which cooperate with the bolts 46 are located on the top wall 26 of the cover 24. Alternatively, the bolt may be reversed with its head adjacent to 26 and the bolt 50 adjacent to board 16.

Other nuts 52 are threaded on the bolts 46 and engage the upper end of the spacer 42. By tightening these nuts 52, the flange 14 and the heat sink plate 18 are clamped between the board 16 and the spacer 42. Desirably this is done before the cover 24 is put in place. Then, the cover is placed on the board in contact with the heat sink plate 16. The nuts 50 are threaded on the bolt and clamp the cover to the board. The clamping action is independent. The transistor is clamped securely in place and provides good thermal contact with the flange 14 thereof and the heat sink plate 18. The cover is independently held in place by the nuts 50.

Inasmuch as the spacer is insulating and there is clearance in the holes 36 and 38, the bolts 46 and the nuts 50 are insulated from the transistor 12. Also the cover is clamped securely in place. The entire assembly provides good thermal contact and insulation and protection for the transistor 12. At also prevents the electrical arcing. To facilitate the assembly and to insure insulation from the heat sink plate 18, a insulating sleeve 56 may be placed in the hole 36 in the heat sink plate 18. A washer 58 and a washer 60 also facilitate the clamping action.

Referring to FIG. 3, parts of the mounting assembly shown therein which are similar to parts shown and described in FIGS. 1 and 2 are identified with like reference numerals. In the FIG. 3 embodiment, the hole 34 in the top wall 26 of the cover 24 is provided with a step 64. A sleeve 66 similar to the sleeve 42 has a height such that the top end 68 thereof extends above the level of the step 64. A bolt 70 extends through the aligned hole 44 in the spacer 66 and the holes 36 in the flange 14, 40 in the heat sink plate 18, and 38 in the printed circuit board 16. The head 72 of the bolt 70 and a washer 74 between the head and the top end 68 of the spacer 66 first engage the top end 68 and clamp the spacer 66 and board 68 together, when a nut 76 and its washer 78 are fastened on to the bolt 46. The flange 14 and the heat sink plate 18, with their intervening thermally conductive but insulating pad 22 are clamped between the board 16 and the spacer 66 thereby providing the butt joint. By tightening or turning in toward each other the head 72 and the nut 76, the washer 74 engages the step 64 and clamps the cover down on the board 16. Accordingly the transistor is independently clamped with good thermal contact with the heat sink plate 18 on the board 16 and the cover is independently clamped on the board 16 by being held against the heat sink plate 18. A flange 80 on the cover may be provided so as to increase the contact area of the cover on the plate 18. This assembly allows the transistor to function, heat to be dissipated and the prevention of electrical arcs.

Figure 4:
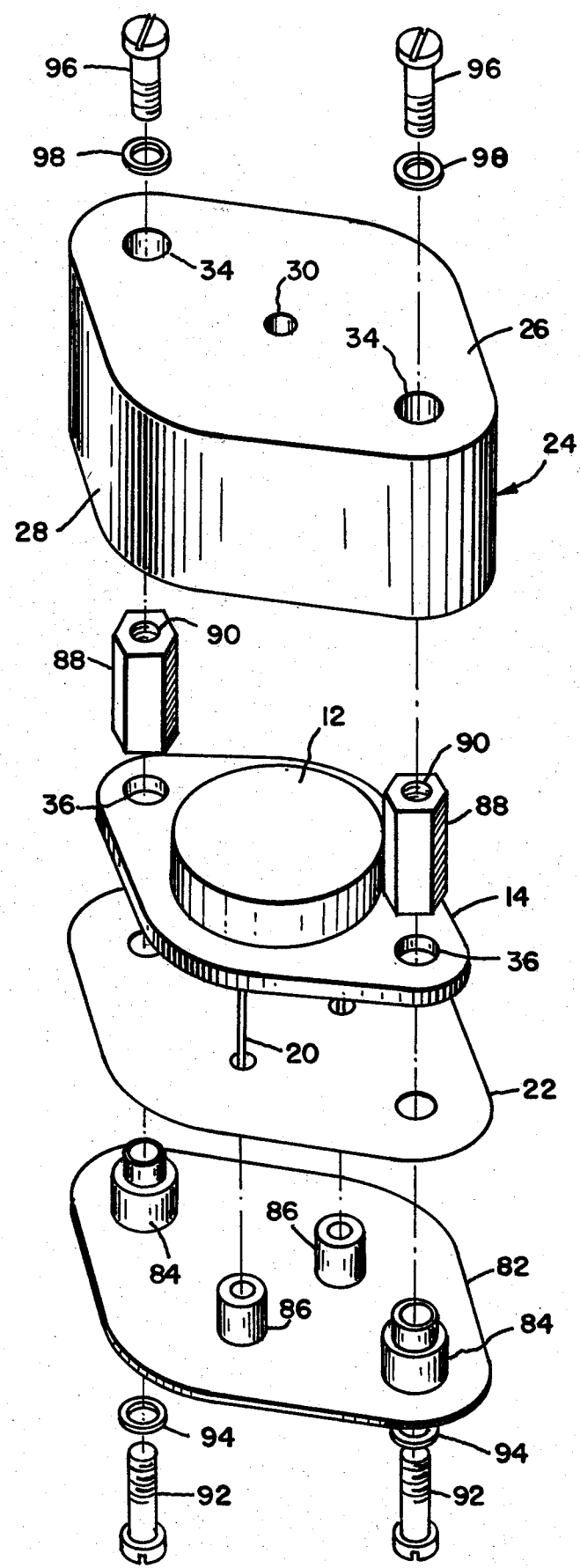
FIG. 4 is a exploded view showing a mounting assembly in accordance with still another embodiment of the invention.

Referring to FIG. 4, parts which are similar to parts shown in FIGS. 1 and 2 are identified by like reference numerals. The heat sink plate 18 and the board 16 are not shown in FIG. 4. However, they are disposed between the thermally conductive electrically insulating plate 22 and a pad 82 of electrically insulating material which is disposed on the underside of the board and has integral therewith, sleeves 84 which extend into the holes 38 and 40 in the board 16 and flange 14 as well as into the hole 36 in the flange 14. Sleeves 86 also extend into holes 21 in the plate 18 and holes 23 in the board 16 (see FIG. 1) for insulating purposes. Hexagonal spacers 88, which may be of conductive material, are mounted in the cover 24 on the flange 14 and have threaded holes 90. Bolts 92, which extend through washers 94, are threaded into the holes 90 in the spacers 88 and serve to clamp the transistor flange 14 and the plate 18 between the board 16 and the bottom end of the spacers 88. Other bolts 96 of insulating material (nylon) extend through washers 98 and the holes 34 and the top wall 26 of the cover 24 into the threaded holes 90 in the spacers 88. These bolts 96 then independently clamp the cover to the board 16 on the plate 18.

From the foregoing description it will be apparent that there has been provided improved mounting assemblies for semiconductor devices and particularly for power transistors. Three embodiments of the invention have been illustrated. Variations and modifications of the herein illustrated embodiments of the invention, within the scope of the invention, will undoubtedly suggest themselves to those skilled in the art. Accordingly the foregoing description should be taken as illustrative and not in a limiting sense.

I claim:

1. A mounting assembly with a semiconductor device upon a circuit board on which a conductive heat dissipating member is disposed, said device having a flange, said mounting assembly comprising a cover having a top wall and side walls defining an opening higher than said device and larger than said flange in which said device is received, said device being disposed with said flange upon said heat dissipating member and spaced from said circuit board by said heat dissipating member, a hole in said flange and holes in said top wall, said member and said board all in alignment with each other, a spacer having a hole, said spacer being disposed upon said flange and between said top wall and said flange with said spacer hole aligned with said holes in said top wall, said flange, said member and said board, and threaded fastener means associated with said spacer and extending through said aligned holes and into said spacer for independently clamping (a) said heat dissipating member and said flange between said spacer and said board and (b) said cover upon said member.

2. The invention as set forth in claim 1 wherein said threaded fastener means comprises bolts means extending through said aligned holes, first means associated with said spacer in which said bolt means is threaded for clamping said flange and said heat dissipating member between said spacer and said board, and second means engageable with said top wall for clamping said cover upon said board.

3. The invention as set forth in claim 2 wherein said first means is a nut threaded on said bolt means above said spacer and said second means is one of a head on said bolt means and a nut threaded on said bolt means.

4. The invention as set forth in claim 2 wherein said second means comprises a step in said hole in said top wall, said spacer extending into said top wall hole above said step, one of a head on said bolt and a nut threaded on said bolt engageable with said spacer for clamping said member and said flange with said board, and said first means comprises said step and said nut which are engageable with each other to clamp said cover upon said board.

5. The invention as set forth in claim 4 wherein said one of said nuts and bolt head is smaller in diameter than the top wall hole above said step, and a washer of diameter larger than the inner diameter of said step between said one of said nut and head and said step.

6. The invention as set forth in claim 1 wherein said spacer has an internal thread in the hole therein, first bolt means extending through said board, said member and said flange and threaded into said threaded spacer hole to provide for the independent clamping of said member and said flange between said spacer and board, second bolt means extending through said cover hole into said threaded spacer hole for independently clamping said cover on said board.

7. The invention as set forth in claim 1 wherein said clamping means includes at least one bolt extending through said holes in said board member and flange, said cover being of insulating material and said spacer being of insulating material, said holes in said member and said flange being of larger diameter than said bolt, and insulating sleeves in said member and flange holes to insulate said bolt from said flange and said member.

8. The invention as set forth in claim 7 further comprising an insulating pad having said sleeves thereon, said pad being disposed on the side of said board opposite said member with said sleeves in said holes in said board, said member and said flange to insulate said bolt from said board, said flange and said member.

9. The invention as set forth in claim 7 further comprising a pad of thermally conductive, electrically insulating material between said flange and said member.

10. The invention as set forth in claim 1 further comprising a thermally conductive, electrically insulating pad between said cover side walls and heat dissipating member, a butt joint between said cover and heat dissipating member through said pad whereby to provide a shield around said transistor to prevent arcing.

* * * * *